(12) United States Patent
Mankosa et al.

(10) Patent No.: US 11,344,896 B2
(45) Date of Patent: May 31, 2022

(54) SPARGER STATUS SENSOR SYSTEM

(71) Applicant: Eriez Manufacturing Co., Erie, PA (US)

(72) Inventors: Michael J. Mankosa, Erie, PA (US); Ronald P. Krahe, Girard, PA (US); James Jukkola, Erie, PA (US)

(73) Assignee: Eriez Manufacturing Co., Erie, PA (US)

( * ) Notice: Subject to any disclaimer, the term of this patent is extended or adjusted under 35 U.S.C. 154(b) by 14 days.

(21) Appl. No.: 16/329,171

(22) PCT Filed: Aug. 31, 2017

(86) PCT No.: PCT/US2017/049743
§ 371 (c)(1),
(2) Date: Feb. 27, 2019

(87) PCT Pub. No.: WO2018/045237
PCT Pub. Date: Mar. 8, 2018

(65) Prior Publication Data
US 2019/0184406 A1    Jun. 20, 2019

Related U.S. Application Data

(60) Provisional application No. 62/382,011, filed on Aug. 31, 2016.

(51) Int. Cl.
*B03D 1/02* (2006.01)
*B03D 1/24* (2006.01)
(Continued)

(52) U.S. Cl.
CPC .......... *B03D 1/028* (2013.01); *B03D 1/1487* (2013.01); *B03D 1/242* (2013.01);
(Continued)

(58) Field of Classification Search
CPC ..................................... B03D 1/028
See application file for complete search history.

(56) References Cited

U.S. PATENT DOCUMENTS 3,699,560 A * 10/1972 Meunier .................... G01F 1/24
340/611
6,238,569 B1 * 5/2001 Favret, Jr. .......... B01D 17/0205
210/710

(Continued)

OTHER PUBLICATIONS

Chen et al, Inductive Displacemetn Sensors with a Notch Filter for an Active Magentic Bearing System Jul. 2014, Sensors, 14, 12640-12657.*

*Primary Examiner* — Peter Keyworth
(74) *Attorney, Agent, or Firm* — Jonathan M. D'Silva; MMI Intellectual Property

(57) ABSTRACT

A sparger for injection of bubbles into a flotation system comprises a housing, a movable rod assembly, and a sensor system that comprises a sensor and a target that move relative to each other. One of the sensor and the target is located in the housing and the other is located on or attached to the movable rod assembly. The sensor for measuring motion, including position and vibration, relative to the target based on the movement of the movable rod assembly. The sensor system for determining operating parameters of the sparger based on the analysis of the measurement of the motion of the sensor relative to the target.

22 Claims, 2 Drawing Sheets

(51) Int. Cl.
  *B03D 1/14* (2006.01)
  *G01R 33/07* (2006.01)
  *G01P 13/00* (2006.01)
(52) U.S. Cl.
  CPC .......... *G01P 13/0073* (2013.01); *G01R 33/07* (2013.01); *G01P 13/00* (2013.01)

(56) References Cited

U.S. PATENT DOCUMENTS

| | | | | |
|---|---|---|---|---|
| 2005/0092308 A1* | 5/2005 | Tsokonas | ............... | F02M 26/67 123/568.23 |
| 2010/0032492 A1* | 2/2010 | Grimm | ............... | A01M 7/0089 239/1 |
| 2012/0324987 A1* | 12/2012 | Khibnik | ............. | G01N 15/0266 73/112.01 |

\* cited by examiner

SPARGER STATUS SENSOR SYSTEM

BACKGROUND

In mineral flotation applications, sparging systems are used to promote the attachment and recovery of hydrophobic particles through the generation of a fine bubble dispersion. This is accomplished by arranging a series of spargers in the periphery of flotation tanks. The spargers generate a large amount of bubbles at the optimum size for the given application. Specifically, they are designed to generate high rates of bubble surface area which guarantees a high probability of attachment and improved recoveries of hydrophobic particles. Smaller mineral processing plants could have as few as a single flotation tank while larger plants could have several dozen flotation tanks. Each flotation tank could have thirty spargers or more. This means that larger processing plants could easily have hundreds of spargers that represent a significant investment in equipment, maintenances, and repair.

Prior art spargers were essentially left to their own devices as it was difficult to monitor real time performance and provide feedback and troubleshooting for spargers that were operating inefficiently or not at all. It was only in routine maintenance that problems were uncovered, if at all.

What is presented is a sparger for the injection of bubbles into flotation systems which incorporates sensors and mechanisms that provide status indicators on the functioning of an individual sparger as well as systems for providing networked communications between a collection of spargers on a single flotation system or in a facility that has multiple flotation systems.

SUMMARY

What is presented is a sparger and a sensor system for a sparger that comprises a housing and a movable rod assembly for injection of bubbles into a flotation system. The sensor system comprises a sensor and a target that move relative to each other. One of the sensor and the target is located in the housing and the other is located on or attached to the movable rod assembly. The sensor is for measuring motion, including position and vibration, relative to the target based on the movement of the movable rod assembly. The sensor system for determining operating parameters of the sparger based on the analysis of the measurement of the movement of the sensor relative to the target. The sensor is one of a Hall Effect sensor, an inductive proximity sensor, or an optical proximity sensor. The sensor system measures the motion of the movable rod assembly, the position of the movable rod assembly, and the vibration of the movable rod assembly. The sensor system determines the presence of failure modes of the sparger that is any of a plugged nozzle, a torn diaphragm, loss of pressure, or loss of fluid.

The sensor from the sensor system outputs a signal to a signal processor. The signal processor comprises a sensor signal conditioner, an analog to digital converter, and a sensor signal analyzer. The signal processor generates a signal output to indicators located on the housing and/or to a central control unit via wired or wireless remote communication.

In some embodiments, a network of sensor systems for spargers for injection of bubbles into a flotation system comprises a plurality of spargers that each comprise a housing, a movable rod assembly and a sensor system. Each sensor system further comprises a sensor and a target that move relative to each other, wherein one of the sensor and the target is located in the housing and the other is located in or attached to the movable rod assembly. The sensor is for measuring motion, including position and vibration, relative to the target based on the movement of the movable rod assembly. The sensor system for determining operating parameters of the sparger based on the analysis of the measurement of the movement of said sensor relative to said target. Each sensor outputs a signal to a signal processor that generates a signal output to a central control unit. The central control unit aggregates and analyzes each signal to display operating parameters of each corresponding sparger and provide overall system performance data.

In some embodiments, the plurality of spargers is mounted to a single flotation separation system. In other systems the said plurality of spargers is mounted to multiple flotation separation systems. The signal output to said central control unit is transmitted wirelessly.

Those skilled in the art will realize that this invention is capable of embodiments that are different from those shown and that details of the apparatus and methods can be changed in various manners without departing from the scope of this invention. Accordingly, the drawings and descriptions are to be regarded as including such equivalent embodiments as do not depart from the spirit and scope of this invention.

BRIEF DESCRIPTION OF DRAWINGS

For a more complete understanding and appreciation of this invention, and its many advantages, reference will be made to the following detailed description taken in conjunction with the accompanying drawings.

DETAILED DESCRIPTION

Figure 1:
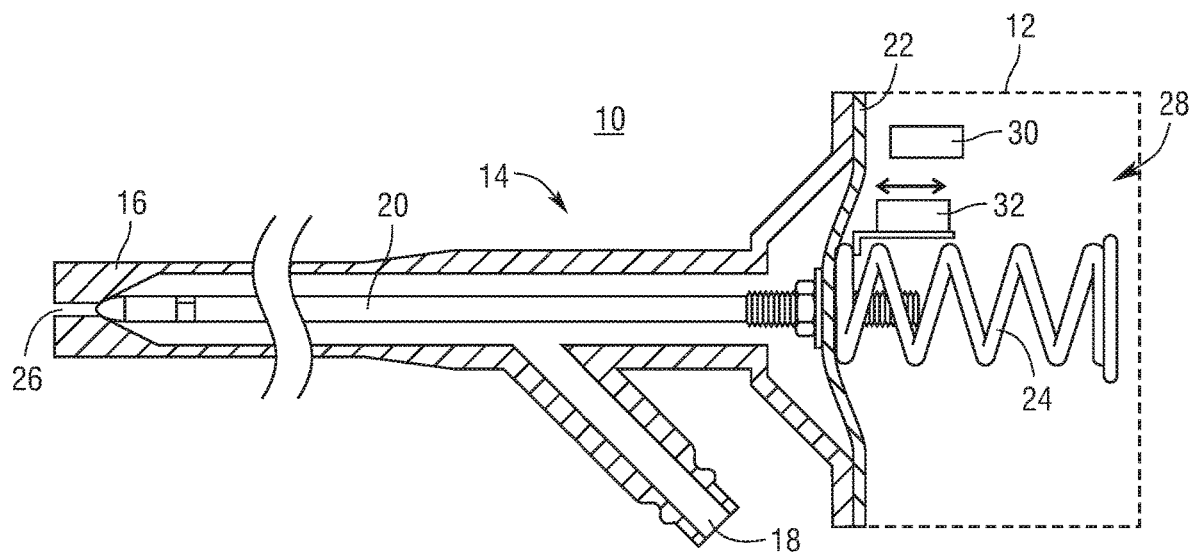
FIG. 1 is a cut out view of a sparger operating at low pressure with the sparger in the closed position.

Referring to the drawings, some of the reference numerals are used to designate the same or corresponding parts through several of the embodiments and figures shown and described. Corresponding parts are denoted in different embodiments with the addition of lowercase letters. Variations of corresponding parts in form or function that are depicted in the figures are described. It will be understood that variations in the embodiments can generally be interchanged without deviating from the invention.

Figure 2:
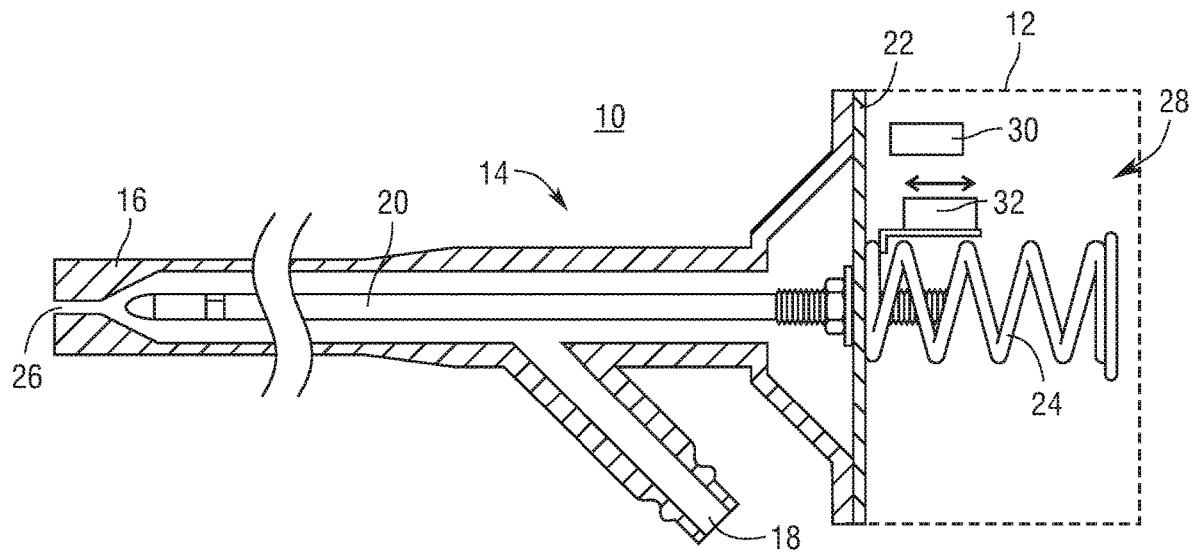
FIG. 2 is a cut out view of a sparger operating at high pressure with the sparger in the open position.

As shown in FIGS. 1 and 2, spargers 10 comprise a housing 12 and a movable rod assembly 14. The movable rod assembly 14 further comprises a nozzle 16 that is inserted into the liquid medium inside a flotation tank (not shown). A source compressed gas is connected to the inlet 18. A rod 20 is connected to a diaphragm 22 that is further connected to a spring 24. As shown in FIG. 1 when pressure is low, the spring 24 pushes the diaphragm 22 and the rod 20 into the nozzle 16 thereby sealing the nozzle tip 26 and preventing liquid from the flotation tank from flowing back into the sparger. As shown in FIG. 2, when higher pressure is applied by the introduction compressed gas from the inlet 18, the pressure acts on the diaphragm 22 to compress the spring 24, retracting the rod 20, and opening the nozzle tip 26 which allows the gas to be released through the nozzle tip

26 to create bubbles in the liquid medium in the flotation tank. In some embodiments, liquid may be added to the compressed gas stream at the inlet 18 to enhance bubble formation.

A sensor system 28 is mounted within the housing 12. The sensor system 28 comprises a sensor 30 and a target 32. In the embodiment shown in FIGS. 1 and 2 it is preferred that the sensor 30 is mounted in a stationary position within the housing 12 while the target 32 is linked with the movable rod assembly 14 such that the target 32 moves in concert with the movable rod assembly 14. The figures show that the target 32 is connected to the spring 24 but it should be understood that the actual mounting location of the target 32 to the movable rod assembly 14 is immaterial so long as the movement of target 32 is an accurate reflection of the movement of the movable rod assembly 14. It is understood that the position of the target 32 and the sensor 30 could be switched such that the target 32 is stationary while the sensor 30 moves with the movable rod assembly 14. The sensor system 28 will operate identically in either configuration.

The sensor system 28 could be any type of system that has a sensor 30 that measures the motion, including position and vibration, of a target 32 based on the movement of the movable rod assembly 14. Examples include Hall Effect sensors and other magnetic sensors, optical sensors for visual recognition of a reflective target, and inductive sensors with a metallic target. Depending on the type of sensor used, the target 32 does not have to be a separate element from the movable rod assembly 14 as is depicted in FIGS. 1 and 2. Components of the movable rod assembly 14 itself could be the target 32. So long as the sensor is able to detect and measure motion, including position and vibration, of the movable rod assembly 14, then the purpose of the target 32 is met without any additional element being present. The target 32 could be the spring 24, a nut or washer on the movable rod assembly 14, or even the rod 20.

With the sparger 10 in the closed position as shown in FIG. 1, the sensor 30 determines the motion of the target 32 relative to it. With no movement the sensor system 28 is able to determine that no gas is passing through the sparger 10 and that the sparger 10 is not in operation. When higher pressure is applied by the introduction of compressed gas from the inlet 18, as shown in FIG. 2, the rod 20 moves and vibrates as fluid flows through the sparger 10 and the nature of these vibrations provides an indication of the functioning of the sparger 10. The output from the sensor 30 is an indirect measure of the pressure at which compressed gas is introduced through the inlet 18 and provides operating parameters and failure modes of the sparger 10. The measured motion of the target 32 relative to the sensor 30 indicates the position and motion of the rod 20 and is a measure of the opening of the nozzle tip 26. Minimum useful indication would be "fully open" vs. "not fully open". More nuanced sensors could measure continuous position changes in the rod 20 or percentage opening of the nozzle tip 26 from fully closed to fully open. If the sparger 10 is plugged, the sensor 30 would record that the rod 20 will move but that it doesn't vibrate. If the diaphragm 22 tears, pressure drops and a partial position change of the rod 20 will be recorded as the rod 20 would not be able to move as far because the compressed gas has another outlet to escape.

Measurements from the sensor system 28 could be combined with measurements of other sparger 10 parameters to get a more accurate reading on system performance. For example, the interpretations of the readings from the sensor system 28 could be correlated with direct measurement of the compressed gas flow from the inlet 18 using, for example, a vane flow sensor, a hot wire flow sensor, differential pressure measurement across an orifice, differential temperature measurement across an orifice, or a microphone to sense flow noise. So, for example, a determination that a nozzle 16 is plugged based on a reading from the sensor system 28 can be correlated with a reading from the compressed gas flow to confirm whether and to what extent compressed gas is flowing into the sparger 10.

Figure 3:
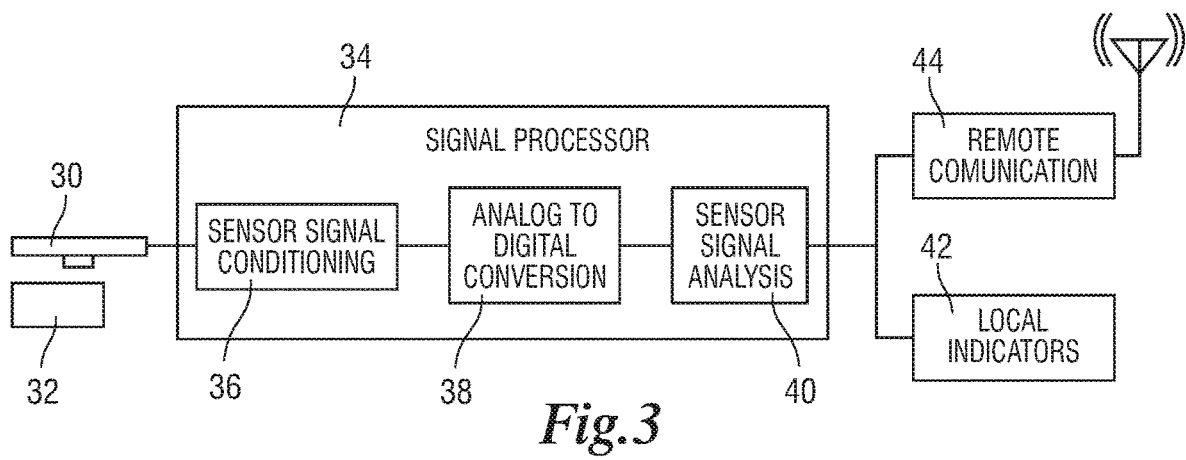
FIG. 3 is a flow chart outlining the process steps from the sensor system through the signal processor and its output.

Whatever the readings of the sensor system 28, FIG. 3 shows how those readings are communicated to an operator for analysis and to determine operation status. Signals from the sensor 30 are transmitted to a signal processor 34 where they are conditioned 36 and converted to a digital signal 38 for further analysis 40. The signal is scaled based on stored calibration values and compared to threshold setpoints to determine whether the sparger 10 is in the expected operating conditions. The results of the analysis can be output to local indicators 42 at the sparger 10 by, for example, LED indicators on the housing or some other display or output. The results can also be transmitted via remote communications 44 to a central control unit by radio communications, along with the raw sensor data, if desired. Various embodiments of the sensor system may have only local indicators 42, only remote communications 44, or both. In various embodiments, the remote communications 44 may be wireless, wired, or both as needed for the particular application.

Figure 4:
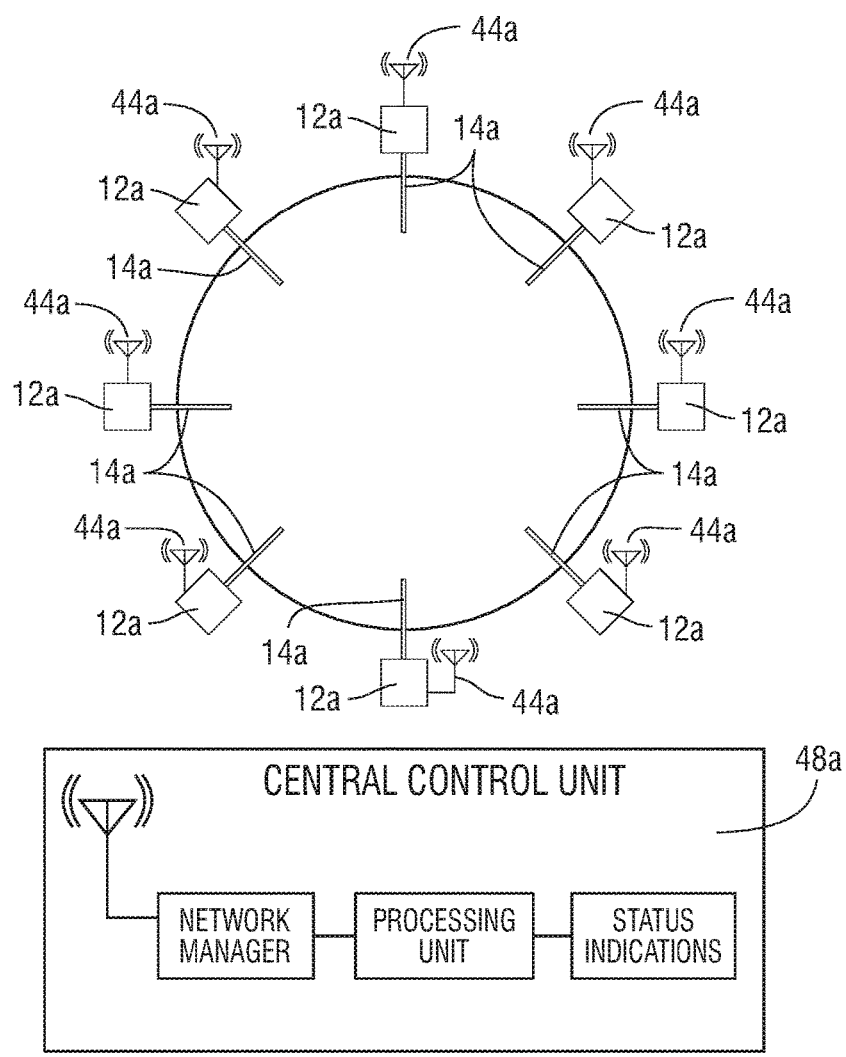
FIG. 4 shows a series of spargers installed on a flotation tank networked wirelessly to a central control unit.

FIG. 4 shows an embodiment of how the remote communications 44a systems of a sensor system housed within a system of spargers 10a can be configured to form a network of sensor systems. In this example, a series of spargers 10a is installed in a flotation tank 46a. The remote communications 44a from each sparger 10a may be wired or wirelessly connected to a central control unit 48a which receives, aggregates, and analyzes the information from all spargers and displays the overall system status to the operator. The central control unit 48a may display and/or store the data locally, forward the data to another control system, or both.

The central control unit 48a aggregates the status information from multiple spargers and may perform additional analysis on the data. This includes comparing data from one sparger (or group of spargers) with another sparger (or group of spargers). The central control unit 48a could also correlate sparger data with data from other types of sensors or status indicators that may be available in the plant. For example, if all of the spargers in the plant are closed, the central control unit 48a could be directed to check the status of the air compressor rather than indicating that all of the spargers are faulty. In addition, the central control unit 48a could compare data from one or more spargers over time, looking at trends and variations.

The central control unit 48a could also display status indications in some aggregate form to clearly inform the operator how many spargers are not operating correctly and where the offenders are located in the plant. The status could be presented in a graphical display, possibly with a touchscreen for user interaction, discrete indicators, or Integrated into a larger (e.g. plant-wide) control/indication system.

The central control unit 48a could communicate status remotely to plant operators, supervisors, and/or others if desired. This could include, but is not limited to, fault alerts, horns, beacons, loudspeaker annunciator, email, text message, real-time status information, remote PC, or a smartphone application.

This invention has been described with reference to several preferred embodiments. Many modifications and alterations will occur to others upon reading and understanding the preceding specification. It is intended that the invention be construed as including all such alterations and modifications in so far as they come within the scope of the appended claims or the equivalents of these claims.

What is claimed is:

1. A sensor system for a sparger having a housing configured to receive a flow of compressed gas for injection of bubbles into a flotation system, the sensor system comprising:
   a movable rod assembly within said housing comprising a nozzle and a rod within said nozzle, said rod connected to a diaphragm that is further connected to a spring such that compressed air entering said housing acts on said diaphragm to compress said spring and retract said rod from said nozzle;
   a sensor and a target that move relative to each other, wherein one of said sensor and said target is located in the housing the other is located on or attached to the movable rod assembly;
   said sensor for measuring parameters of motion, position, and vibration, relative to said target based on the movement of said movable rod assembly;
   said sensor system for determining operating parameters of the sparger based on analysis of the measured motion, position, and vibration of said sensor relative to said target.

2. The sensor system of claim 1 in which the sensor is one of a Hall Effect sensor, an inductive proximity sensor, and an optical proximity sensor.

3. The sensor system of claim 1 in which said target is a component of the movable rod assembly.

4. The sensor system of claim 1 in which said sensor measures the motion of the movable rod assembly, the position of the movable rod assembly, and the vibration of the movable rod assembly.

5. The sensor system of claim 1 in which said the sensor system determines the presence of failure modes of the sparger that is any of a plugged nozzle, a torn diaphragm, loss of pressure, or loss of fluid.

6. The sensor system of claim 1 in which said sensor outputs a signal to a signal processor.

7. The sensory system of claim 1 in which said sensor outputs a signal to a signal processor and said signal processor comprises a sensor signal conditioner, an analog to digital converter, and a sensor signal analyzer.

8. The sensor system of claim 1 in which said sensor outputs a signal to a signal processor and said signal processor generates a signal output to indicators located on the housing.

9. The sensor system of claim 1 in which said sensor outputs a signal to a signal processor and said signal processor generates a signal output to a central control unit via wired or wireless remote communication.

10. A sparger for injection of bubbles into a flotation system comprising:
    a housing configured to receive a flow of compressed gas;
    a movable rod assembly within said housing comprising a nozzle and a rod within said nozzle, said rod connected to a diaphragm that is further connected to a spring such that compressed air entering said housing acts on said diaphragm to compress said spring and retract said rod from the nozzle;
    a sensor system that comprises a sensor and a target that move relative to each other, wherein one of said sensor and said target is located in said housing the other is located on or attached to said movable rod assembly;
    said sensor system for measuring parameters of motion, position, and vibration, relative to said target based on the movement of said movable rod assembly; and
    said sensor system for determining operating parameters of the sparger based on analysis of the measured motion, position, and vibration of said sensor relative to said target.

11. The sparger of claim 10 in which said sensor system is one of a Hall Effect sensor, an inductive proximity sensor, and an optical proximity sensor.

12. The sparger of claim 10 in which said target is a component of said movable rod assembly.

13. The sparger of claim 10 in which said sensor measures the motion of said movable rod assembly, the position of said movable rod assembly, and the vibration of said movable rod assembly.

14. The sparger of claim 10 in which said the sensor system determines the presence of failure modes of the sparger that is any of a plugged nozzle, a torn diaphragm, loss of pressure, or loss of fluid.

15. The sparger of claim 10 in which said sensor outputs a signal to a signal processor.

16. The sparger of claim 10 in which said sensor outputs a signal to a signal processor and said signal processor comprises a sensor signal conditioner, an analog to digital converter, and a sensor signal analyzer.

17. The sparger of claim 10 in which said sensor outputs a signal to a signal processor and said signal processor generates a signal output to indicators located on the housing.

18. The sparger of claim 10 in which said sensor outputs a signal to a signal processor and said signal processor generates a signal output to a central control unit.

19. A network of sensor systems for spargers for injection of bubbles into a flotation system, comprising:
    a plurality of spargers that each comprise a housing configured to receive a flow of compressed gas;
    a movable rod assembly within each housing comprising a nozzle and a rod within said nozzle, said rod connected to a diaphragm that is further connected to a spring such that compressed air entering said housing acts on said diaphragm to compress said spring and retract said rod from said nozzle;
    each said sparger comprising a sensor system, wherein each said sensor system further comprises a sensor and a target that move relative to each other, wherein one of said sensor and said target is located in said housing the other is located or attached to said movable rod assembly, said sensor for measuring parameters of motion, position, and vibration relative to said target based on the movement of said movable rod assembly, and said sensor system for determining operating parameters of the sparger based on analysis of the measured motion, position, and vibration of said sensor relative to said target; and
    each sensor outputs a signal to a signal processor and said signal processor generates a signal output to a central control unit, wherein said central control unit aggregates and analyzes each said signal to display operating parameters of each corresponding said sparger and provide overall system performance data.

20. The network of sensor systems of claim 19 in which said plurality of spargers is mounted to a single flotation separation system.

21. The network of sensor systems of claim 19 in which said plurality of spargers is mounted to multiple flotation separation systems.

22. The network of sensor systems of claim 19 in which said signal output to said central control unit wirelessly.

\* \* \* \* \*